(12) United States Patent
Donlan et al.

(10) Patent No.: US 10,073,730 B1
(45) Date of Patent: Sep. 11, 2018

(54) SINGLE QUORUM VERIFICATION OF ERASURE CODED DATA

(71) Applicant: Amazon Technologies, Inc., Seattle, WA (US)

(72) Inventors: Bryan James Donlan, Seattle, WA (US); Claire Elizabeth Suver, Seattle, WA (US); Ryan Charles Schmitt, Seattle, WA (US); Paul David Franklin, Seattle, WA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 14/548,182

(22) Filed: Nov. 19, 2014

(51) Int. Cl.
*G06F 11/00* (2006.01)
*G06F 11/10* (2006.01)
*H03M 13/00* (2006.01)

(52) U.S. Cl.
CPC ........ *G06F 11/1004* (2013.01); *H03M 13/00* (2013.01)

(58) Field of Classification Search
CPC ............ G06F 11/1076; G06F 11/1068; G06F 11/1072; H03M 13/293
See application file for complete search history.

(56) References Cited

U.S. PATENT DOCUMENTS

| | | | | |
|---|---|---|---|---|
| 8,810,593 | B2* | 8/2014 | Gildfind | G06Q 30/0241 345/501 |
| 8,856,593 | B2* | 10/2014 | Eckhardt | G06F 11/2028 709/217 |
| 8,868,825 | B1* | 10/2014 | Hayes | G06F 12/0246 711/103 |
| 8,903,871 | B2* | 12/2014 | Hwang | H04L 67/1008 707/803 |
| 8,990,212 | B1* | 3/2015 | Zenger | G06F 17/30424 707/737 |
| 9,298,760 | B1* | 3/2016 | Li | G06F 17/30321 |

* cited by examiner

*Primary Examiner* — Esaw T Abraham
(74) *Attorney, Agent, or Firm* — Davis Wright Tremaine LLP

(57) ABSTRACT

Techniques described and suggested herein include various methods and systems for verifying integrity of redundancy coded data, such as erasure coded data shards. In some embodiments, a quantity of redundancy coded data elements, hereafter referred to as data shards (e.g., erasure coded data shards), sufficient to reconstruct the original data element from which the redundancy coded data elements are derived, is used to generate reconstructed data shards to be used for checking the validity of analogous data shards stored for the original data element.

20 Claims, 8 Drawing Sheets

SINGLE QUORUM VERIFICATION OF ERASURE CODED DATA

BACKGROUND

The use of network computing and storage has proliferated in recent years. The resources for network computing and storage are often provided by computing resource providers who leverage large-scale networks of computers, servers and storage drives to enable clients, including content providers, online merchants and the like, to host and execute a variety of applications and web services. Content providers and online merchants, who traditionally used on-site servers and storage equipment to host their websites and store and stream content to their customers, often forego on-site hosting and storage and turn to using the resources of the computing resource providers. The usage of network computing allows content providers and online merchants, among others, to efficiently and to adaptively satisfy their computing needs, whereby the computing and storage resources used by the content providers and online merchants are added or removed from a large pool provided by a computing resource provider as need and depending on their needs.

The proliferation of network computing and storage, as well as the attendant increase in the number of entities dependent on network computing and storage, has increased the importance of optimizing data performance and integrity on network computing and storage systems. Data archival systems and services, for example, may use various types of error correcting and error tolerance schemes, such as the implementation of erasure coding and data sharding. In implementations using such data sharding methods, integrity checks and other types of data verification, as conducted using previously known techniques, may be resource-heavy, computationally inefficient, or otherwise onerous to complete.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include various methods and systems for verifying integrity of redundancy coded data, such as erasure coded data shards. In some embodiments, a quantity of redundancy coded data elements, hereafter referred to as data shards (e.g., erasure coded data shards), sufficient to reconstruct the original data element from which the redundancy coded data elements are derived, is identified. A version, such as a temporary version, of the original data element may then be generated therefrom, and the validity of the generated version of the original data element may be verified, such as by an integrity verification entity associated with a data storage system on which the redundancy coded data elements are stored. The generated version of the original data element may be verified using various techniques, such as by comparing hash values, checksums, or other integrity information associated therewith, to analogous integrity information associated with the original data element.

Thereafter, the generated version of the original data element may be used to temporarily generate some or all of the data shards for the original data element. The data shards, in some embodiments, are assumed to be valid and correct as a result of the verified integrity of the generated version of the original data element from which they derive. Integrity information may be derived from the generated remainder of data shards, and such integrity information is compared with integrity information stored with or for analogous data shards stored on, for example, a data storage system, for that original data element. Any stored data shards for which the compared integrity differs may be imputed as invalid, whereupon a mitigation workflow may be initiated to remedy the situation. In some embodiments, a successful verification of a subset of data shards may impute, due to the nature of the redundancy coding scheme used, the validity of other data shards for which verification was not directly executed.

Figure 1:
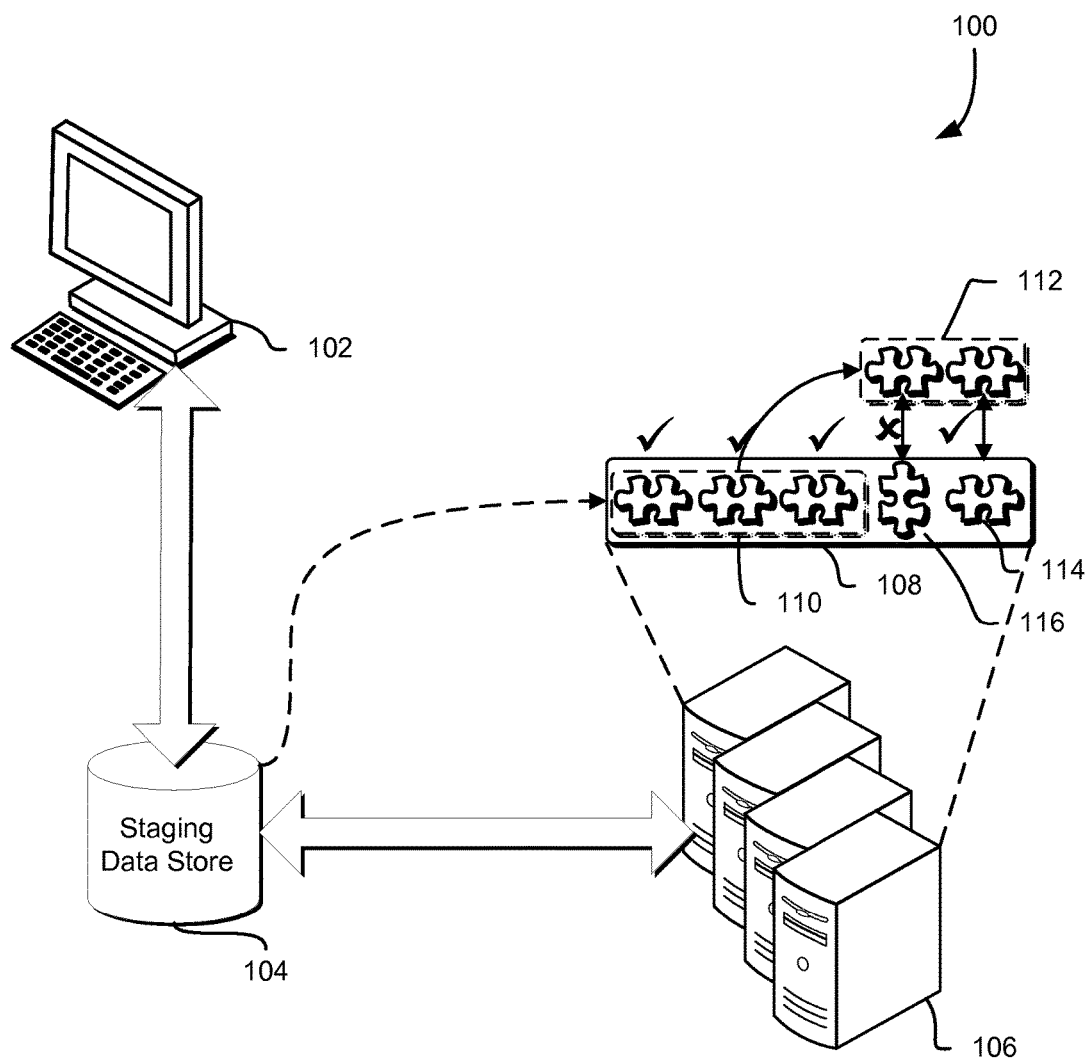
FIG. 1 schematically illustrates an environment in which integrity verification of stored data shards may be verified, in accordance with some embodiments.

FIG. 1 schematically illustrates an environment in which integrity verification of stored data shards may be verified, in accordance with some embodiments. A computing entity 102, such as that of a customer of a computing resource service provider (and, in some embodiments, a customer of a data storage service provided by the computing resource service provider), transacts original data elements through a staging data store 104 with a computing resource service provider 106 that provides one or more data storage services. The computing entity 102 may be any entity capable of providing data to another entity, such as over a network, and by way of example may include physical computing devices and servers, laptops, smartphones, virtual computing systems (such as may be provided by one or more resources of a computing resource service provider), computing services, and the like. The original data elements may be any data, such as data controlled by a customer, and the data may be unencrypted or encrypted. In some embodiments, the original data elements provided by the computing entity 102 may be encrypted by, e.g., a customer, and a component associated with the computing resource service provider 106 may decrypt the data.

The staging data store 104 may be any entity capable of receiving and storing data, and resubmitting the received data to another entity, such as the computing resource service provider 106. Examples may include physical data storage devices such as storage servers, network attached storage devices, hard disk drives, solid state disk drives, and optical drives; virtual data storage data devices such as those provided by a data storage service of a computing resource service provider, databases, and the like. The staging data store 104 may be a component or service associated with, or part of, the computing resource service provider 106. In some embodiments, the staging data store 104 may be used to temporarily hold, or "stage," data destined for another component or service associated with, or provided by, the computing resource service provider. In such embodiments, the received data (e.g., the original data elements received from the computing entity 102) may be held for a fixed and/or scheduled period of time, until some event (e.g., as triggered by either the computing entity 102 or the computing resource service provider 106), or indefinitely. The staging data store 104 may also include various other data manipulation facilities as necessitated by the implementation, such as encryption/decryption, application of data redundancy schemes such as erasure coding, and the like.

The computing resource service provider 106, described in further detail below, may provide one or more data storage services, which may include temporary and/or archival data storage services. The computing resource service provider 106 may also provide various other services capable of handling data, such as cryptographic services, data integrity verification services, authentication services, data policy services, and the like.

In some embodiments, at a time after receiving original data elements from the computing entity 102, e.g., via staging data store 104, one or more resources of the computing resource service provider 106 applies one or more redundancy coding schemes, such as erasure coding, to the original data elements, so as to generate one or more redundancy coded data shards 108. The redundancy coding applied may be any scheme that generates data capable of representing the original data elements in a fault tolerant, or error-resistant fashion. For example, the redundancy coding applied may include various error correcting codes, such as forward error correction codes, erasure coding, and the like. While the present disclosure focuses on erasure codes and erasure coding schemes, any appropriate type of redundancy coding may be used.

It is contemplated that various other data transformations, such as encryption and decryption, may be implemented in connection with any of the techniques described herein. For example, a customer may provide an encrypted form of the original data element, and a resource of the computing resource service provider may decrypt the original data element prior to applying a redundancy coding scheme upon the data element. As another example, the stored data shards 108 may be individually or collectively encrypted, and various decryption and encryption processes may be incorporated during various verification and integrity information generation/comparison processes as necessary, e.g., so as to ensure end-to-end security of the original data element and the associated data shards.

The data shards 108 are, in some embodiments, erasure coded data shards, a quantity 110 of which may be sufficient to reconstruct the original data element. In some embodiments, the quantity 110 may be used, such as by a resource of the computing resource service provider 106 (e.g., an integrity checking entity, which may be a computing entity provided by the computing resource service provider 106), to regenerate a version of the original data element from which the data shards 108 derive. The quantity and identity of the data shards 110 may be selected based on a number of factors, including the contents of each stored data shard, the applied erasure coding scheme, whether or not the analogous data shards were used in a prior reconstruction step (e.g., of the reconstructed version of the original data elements), present or historical computational or network load on the resources hosting one or more of the data shards, and the like. In some embodiments, the quantity 110 may be equal to the minimum number of the data shards 108 necessary to reconstruct the original data element (e.g., as a result of the erasure coding applied), while in other embodiments, the quantity 110 may be greater than that minimum number.

The regenerated version may be stored, temporarily held, or transiently generated, e.g., by a virtual computing system or other resource associated with the computing resource service provider 106, such as an integrity checking entity capable of performing such actions. Integrity information may be generated, such as by the integrity checking entity, for the regenerated version, and compared against analogous integrity information known to be valid and derived from the original data element. The analogous integrity information may, for example, be stored (e.g., on the staging data store, a resource of the computing resource service provider, the integrity checking entity, or the like) from a previous or other action (e.g., the integrity information may be generated by a resource of the computing resource service provider to be used for internal integrity checks of the data shards associated or stored thereon), calculated from the original data element if the original data element is still being held by the staging data store 104, or provided by the computing entity 102.

The integrity information may be any value that derives from the original data element and that may be used to verify the original data element's contents. For example, the integrity information may include checksums, hash values (e.g., as generated by hash functions such as MD4, MD5, SHA/1, SHA/2, SHA/3, RIPEMD-128/160, message authentication codes such as hash-based message authentication codes, key derivation functions such as PBKDF2, or any function that can be used to map digital data of arbitrary size to digital data of predefined size, with a predetermined collision resistance such that the probability of the function mapping two different input values to the same output value is below a predetermined threshold), cyclic redundancy check codes, output of cryptographic functions, and the like. The integrity information may be generated, e.g., by the staging data store, the integrity checking entity, or other resource of the computing resource service provider, and stored in any appropriate location (e.g., in connection with the original data element, in a data store separate from the original data element, etc.). In some embodiments, the integrity information may be generated when needed and discarded when no longer needed. In some embodiments, the integrity information may be persisted after the original data element is discarded.

In some embodiments, the integrity information for the original data element and the reconstructed version of the original data element is compared, e.g., by the integrity checking entity. If the respective integrity information is identical, in some embodiments, the reconstructed version is deemed valid, and an entity reconstructs (e.g., temporarily), from the reconstructed version, one or more data shards 112 analogous to the data shards previously stored in connection with the respective original data element. Any appropriate entity capable of applying the specified redundancy coding to unencoded data may perform the reconstruction, such as the integrity checking entity. The reconstructed data shards 112 may be transiently generated, temporarily stored, or indefinitely stored.

The quantity and identity of the reconstructed data shards 112 generated may be selected based on a number of factors, including the contents of each stored data shard, the applied erasure coding scheme, whether or not the analogous data shards were used in a prior reconstruction step (e.g., of the reconstructed version of the original data elements), present or historical computational or network load on the resources hosting one or more of the data shards, and the like. In some embodiments, the identity and/or quantity of the reconstructed data shards 112 may be selected so as to be analogous to the data shards not used to create the reconstructed version of the original data element. In other embodiments, there may be overlap between the quantity, contents, and/or identity of data shards 110 chosen as the source of reconstruction and the quantity of data shards 112 reconstructed from the reconstructed version of the original data element.

The reconstructed data shards 112 may, in some embodiments, be compared, directly or indirectly, with the respective/analogous stored data shards 114, 116 stored on the resource of the computing resource service provider, so as to determine the validity of at least the stored data shards 114, 116. In some embodiments, the data shards 112, 114, 116 themselves may be compared. In some embodiments, integrity information associated with the data shards may be compared, and in such embodiments, the integrity information for the reconstructed shards 112 may be generated either at the time of reconstruction or after such reconstruction. In such embodiments, the integrity information of the stored data shards 114, 116 may be generated at or near the time of comparison, such as by the integrity checking entity, or may have previously been generated, e.g., at the time when the data shards 114, 116 were initially stored (or at some later point but prior to the comparison). In some embodiments, the integrity information may be stored or otherwise associated with the data shards themselves. In some embodiments, the integrity information may be stored or generated elsewhere, such as in a database associated with the integrity checking entity.

If the integrity information matches (e.g., as illustrated in connection with data shard 114), further action may not be taken. However, if the integrity information does not match (e.g. as illustrated in connection with data shard 116), the stored data shard 116 may be deemed corrupt or invalid, and a mitigation workflow may be initiated with respect to the corrupt or invalid data shard. In some embodiments, as a result of the quantity, content, and/or identity of the reconstructed data shards 112 for which a comparison is made, a full match between the entire set of reconstructed data shards 112 and the analogous stored data shards 114, 116 may imply the validity of the remaining stored data shards 110. In such embodiments, this presumption of validity may be a mathematical result of a) the specific erasure coding scheme used, b) the selection of at least a sufficient number of the data shards 110 to properly regenerate the original data element in light of the specific erasure coding scheme used, c) trusted validation of the regenerated version of the original data element, such as against an integrity value associated with the original data element itself, and d) the identity, quantity, and content of the reconstructed data shards 112 used for the comparison against the remaining stored data shards 114, 116 being sufficient such that all of the stored data shards 108 were used at least once in either a reconstruction step or a verification step.

In some embodiments where the staging data store contains the original data element, an entity such as an integrity checking entity may generate some or all of the data shards and subsequently verify the generated data shards against the data shards 108 stored for that data element. Such a comparison may be direct, e.g., by comparing the data itself, or indirect, such as by using the integrity information previously described. If any data shards are found to be invalid or corrupt (e.g., 116), a mitigation workflow may be initiated.

The mitigation workflow may be any workflow intended to either remedy or mitigate the identified invalid or corrupt data shard(s), or to either remedy or mitigate any effects resulting from the presence of such invalid or corrupt data shard(s). The mitigation workflow may be manual, automated, or a hybrid of manual and automated. For example, a work item may be generated and forwarded to a technician to alert the technician to the identity, content, and/or quantity of the invalid or corrupt data shards, so as to enable the technician to investigate and address, e.g., the root cause of the invalidity or corruption. As another example, an entity, such as the integrity checking entity, may automatically use one of the regenerated data shards 112 to replace the analogous stored data shard 116 found to be corrupt or invalid.

Figure 2:
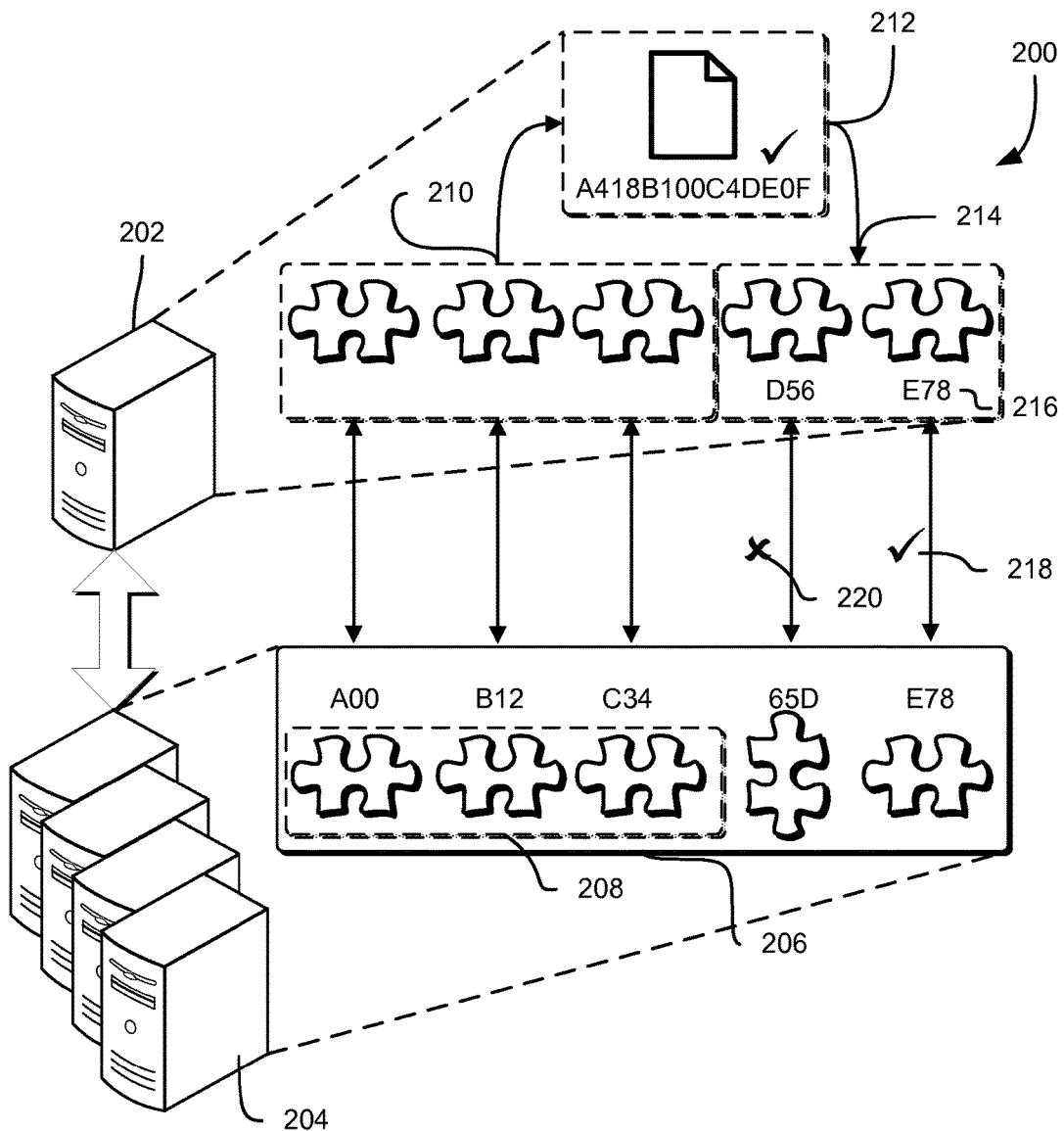
FIG. 2 schematically illustrates various workflows for verifying integrity information of stored data shards using a subset of the stored data shards, in accordance with some embodiments.

FIG. 2 schematically illustrates various workflows for verifying integrity information of stored data shards using a subset of the stored data shards, in accordance with some embodiments. An integrity checking entity 202, such as the integrity checking entity described above in connection with FIG. 1, is connected, such as using a network, to a data storage system 204. The integrity checking entity 202 may be any resource or collection of computing resources capable of receiving and applying transformations to data. For example, the integrity checking entity 202 may be a physical computing device such as a server, or, in some embodiments, may be a virtual computing system such as would be provided by a service of a computing resource service provider. The data storage system 204 may be any resource or collection of resources capable of storing data, such as the various services and storage devices provided by the computing resource service provider described above in connection with FIG. 1 and below in connection with FIGS. 6-8. For example, the data storage system 204 may be a collection of data storage devices that are components of a data storage service or archival service of a computing resource service provider described below in connection with at least FIGS. 6-8.

The data storage system 204 may store a plurality of data shards 206 in connection with one or more original data element, such as the original data element(s) of a customer as described above in connection with FIG. 1. Also as previously described, the data shards 206 may be encoded using a redundancy coding scheme, such as an erasure coding scheme, such that a subset 208 of the stored data shards 206 are sufficient to recreate, such as by the data storage system 204 and/or the integrity checking entity 202, a regenerated version of the original data element. In some embodiments, the subset 208 is selected and provided, e.g., over a network, to the integrity checking entity 202, whereupon it is transiently, temporarily, or indefinitely stored 210. The subset 208 may be selected based on a number of factors, including the contents of each stored data shard, the applied erasure coding scheme, whether or not the analogous data shards were used in a prior reconstruction step (e.g., of the reconstructed version of the original data elements), present or historical computational or network load on the resources hosting one or more of the data shards, and the like. In some embodiments, the selected subset 208 may be randomized so as to spread load amongst the various resources hosting the data shard(s). In some embodiments, the selected subset 208 may include data shards that have been substituted, such as may be the case in erasure coding schemes with a greater number of possible data shards than are necessarily stored to represent the original data element.

In some embodiments, after the selected subset 208 is transferred to the integrity checking entity 202, the integrity checking entity 202 reconstructs a version 212 of the original data element from the selected subset 208. As with the transferred subset 208, the reconstructed version 212 of the original data element may be transiently, temporarily, or indefinitely stored on the integrity checking entity. The validity of the reconstructed version 212 is verified, such as by using integrity information. As previously described in connection with FIG. 1, the integrity information may include checksums, hash values (e.g., as generated by hash functions such as MD4, MD5, SHA/1, SHA/2, SHA/3, RIPEMD-128/160, message authentication codes such as hash-based message authentication codes, key derivation functions such as PBKDF2, or any function that can be used to map digital data of arbitrary size to digital data of predefined size, with a predetermined collision resistance such that the probability of the function mapping two different input values to the same output value is below a predetermined threshold), cyclic redundancy check codes, output of cryptographic functions, and the like. The integrity information may be generated, e.g., by the staging data store 104, the integrity checking entity 202, or other resource of the computing resource service provider (e.g., the data storage system 204), and stored in any appropriate location (e.g., in connection with the original data element, in a data store separate from the original data element, etc.). In some embodiments, the integrity information may be generated by, e.g., the data storage system 204, for other purposes, such as for internal use by the data storage system 204 to verify the integrity of the data shards stored thereon. In some embodiments, the integrity information may be generated when needed and discarded when no longer needed. In some embodiments, the integrity information may be persisted after the original data element is discarded.

In some embodiments, the reconstructed version 212 of the original data element is used, such as by the integrity checking entity 202, to generate one or more reconstructed data shards 214. In some embodiments, the integrity checking entity 202 may also generate integrity information 216 associated with some or all of the reconstructed data shards 214. The quantity and identity of the reconstructed data shards 112 generated may be selected based on a number of factors, including the contents of each stored data shard, the applied erasure coding scheme, whether or not the analogous data shards were used in a prior reconstruction step (e.g., of the reconstructed version of the original data elements), present or historical computational or network load on the resources hosting one or more of the data shards, and the like. In some embodiments, the identity and/or quantity of the reconstructed data shards 112 may be selected so as to be analogous to the data shards not used to create the reconstructed version of the original data element. In other embodiments, there may be overlap between the quantity, contents, and/or identity of data shards 110 chosen as the source of reconstruction and the quantity of data shards 112 reconstructed from the reconstructed version of the original data element.

As previously discussed in connection with FIG. 1, the reconstructed data shards 212 may, in some embodiments, be compared, directly or indirectly, with the respective/analogous subset of the stored data shards 206 stored on the data storage system 204, so as to determine the validity of at least the subset being compared. In some embodiments, the data within the data shards themselves may be compared. In some embodiments, integrity information (e.g., 216) associated with the data shards may be compared, and in such embodiments, the integrity information for the reconstructed shards 214 may be generated either at the time of reconstruction or after such reconstruction. In such embodiments, the integrity information of the stored data shards may be generated at or near the time of comparison, such as by the integrity checking entity 202, or may have previously been generated, e.g., at the time when the stored data shards 206 were initially stored (or at some later point but prior to the comparison, e.g., as may be the case with a scheduled internal checking routine of the data storage system 204). In some embodiments, the integrity information may be stored or otherwise associated with the data shards themselves. In some embodiments, the integrity information may be stored or generated elsewhere, such as in a database associated with the integrity checking entity 202.

Also as previously discussed, if the integrity information matches (e.g., 218), the data shard may be deemed valid. However, if the integrity information does not match (e.g. 220), the associated stored data shard may be deemed corrupt or invalid, and a mitigation workflow may be initiated with respect to that corrupt or invalid data shard. In some embodiments, as a result of the quantity, content, and/or identity of the reconstructed data shards 214 for which a comparison is made, a full match between the entire set of reconstructed data shards 214 and the analogous stored data shards 206 may imply the validity of the remaining stored data shards 206. In such embodiments, this presumption of validity may be a mathematical result of a) the specific erasure coding scheme used, b) the selection of at least a sufficient number of the data shards 208 to properly regenerate the original data element in light of the specific erasure coding scheme used, c) trusted validation of the regenerated version of the original data element, such as against an integrity value associated with the original data element itself, and d) the identity, quantity, and content of the reconstructed data shards 214 used for the comparison against the remaining stored data shards 206 being sufficient such that all of the stored data shards 206 were used at least once in either a reconstruction step or a verification step.

The mitigation workflow may be any workflow intended to either remedy or mitigate the identified invalid or corrupt data shard(s), or to either remedy or mitigate any effects resulting from the presence of such invalid or corrupt data shard(s). The mitigation workflow may be manual, automated, or a hybrid of manual and automated. For example, a work item may be generated and forwarded to a technician to alert the technician to the identity, content, and/or quantity of the invalid or corrupt data shards, so as to enable the technician to investigate and address, e.g., the root cause of the invalidity or corruption. As another example, an entity, such as the integrity checking entity, may automatically use some or all of the regenerated data shards 216 to replace the analogous stored data shard found to be corrupt or invalid. The mitigation workflow may be performed and/or initiated by any appropriate entity, such as the integrity checking entity 202, a component of the data storage system 204, or some other resource of a computing resource service provider to which the integrity checking entity 202 and/or the data storage system 204 is associated.

Figure 3:
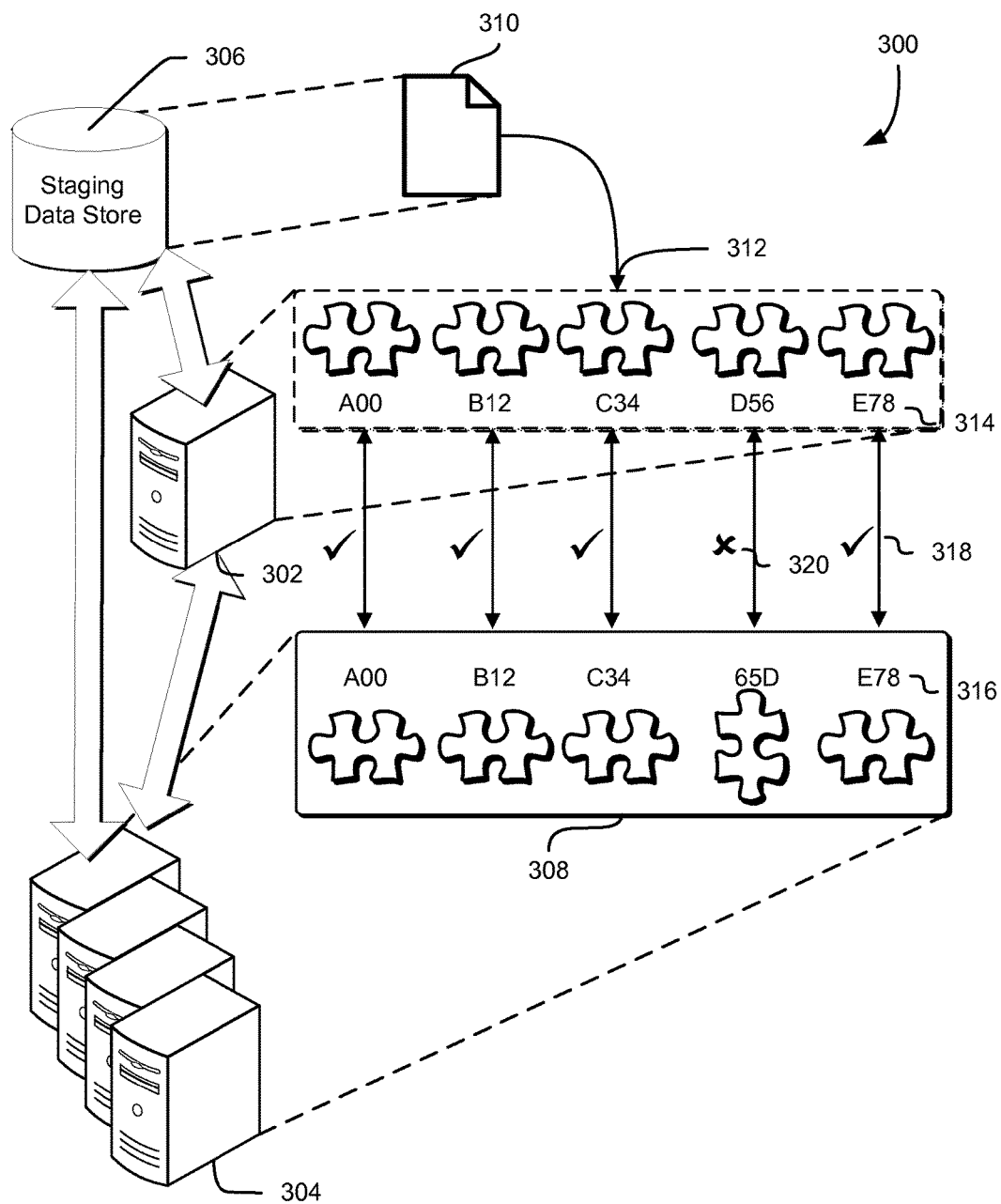
FIG. 3 schematically illustrates various workflows for verifying integrity information of stored data shards using integrity information associated with original data elements associated therewith, in accordance with some embodiments.

FIG. 3 schematically illustrates various workflows for verifying integrity information of stored data shards using original data elements associated therewith, in accordance with some embodiments. A integrity checking entity 302, in some embodiments similar to the integrity checking entity described above in connection with FIGS. 1-2, connects, e.g., over a network, with a data storage system 304 and a staging data store 306. The data storage system 304 may be similar to that described in connection with at least FIGS. 1-2, and the staging data store may be similar to that described in connection with at least FIG. 1. In some embodiments, the staging data store 306 may also be connected, e.g., over a network, with data storage system 304, such as may be the case in an implementation of a data storage service or a data archival service provided by a computing resource service provider. In some embodiments, the staging data store 306, the integrity checking entity 302, and the data storage system 304 are components and/or resources of a computing resource service provider.

The data storage system 304 may have stored thereon a plurality of data shards 308 associated with one or more original data elements, such as original data elements provided by a customer of the computing resource service provider. In some embodiments, the staging data store 306 may store, temporarily, transiently, or indefinitely, original data element(s) 310, such as received from the customer. As previously described in connection with FIGS. 1-2 above, the data shards may represent a redundancy coded (e.g., erasure coded) version of the original data element 310.

In some embodiments, at a time after receiving a request or command to verify the validity of the stored data shards 308, the integrity checking entity 302 retrieves the original data element 310, e.g., from the staging data store 306, and generates a plurality of reconstructed data shards 312 therefrom. In some embodiments, the redundancy coding scheme used to encode the stored data shards 308 is the same redundancy coding scheme used to encode the reconstructed data shards 312. In some embodiments, the integrity checking entity 302 also generates integrity information 314 associated with the reconstructed data shards 312, such as integrity information described above in connection with FIGS. 1-2.

In some embodiments, the reconstructed data shards 312 are compared against the stored data shards 308 so as to verify the validity of the stored data shards 308. The comparison may be direct, or in the alternative, integrity information based on some or all of the individual reconstructed data shards may be compared with the analogous integrity information for the stored data shards, so as to identify any mismatches. In the event that the respective data shards 312, 308 match, the respective stored data shard of the pair may be deemed valid, while to the extent that the respective data shards 312, 308 are mismatched, the respective stored data shard for which a mismatch was detected may be determined to be invalid or corrupt, and a mitigation workflow may be initiated, e.g., by the integrity checking entity 302 in a fashion similar to that described above in connection with FIGS. 1-2.

It is contemplated that various aspects of the embodiments illustrated and described in connection with FIGS. 2 and 3 may be combined as necessitated by the requirements of a particular implementation. For example, some embodiments may incorporate aspects described in connection with FIG. 2 if access to the original data element 310 is difficult, suboptimal, or impossible, while the same embodiments may also incorporate aspects described in connection with FIG. 3 if the original data element 310 is readily accessible. As another example, in certain embodiments, the incorporated aspects may be sensitive to computational, network, and other demand, and switch between various techniques so as to optimize for certain dynamic use cases.

Figure 4:
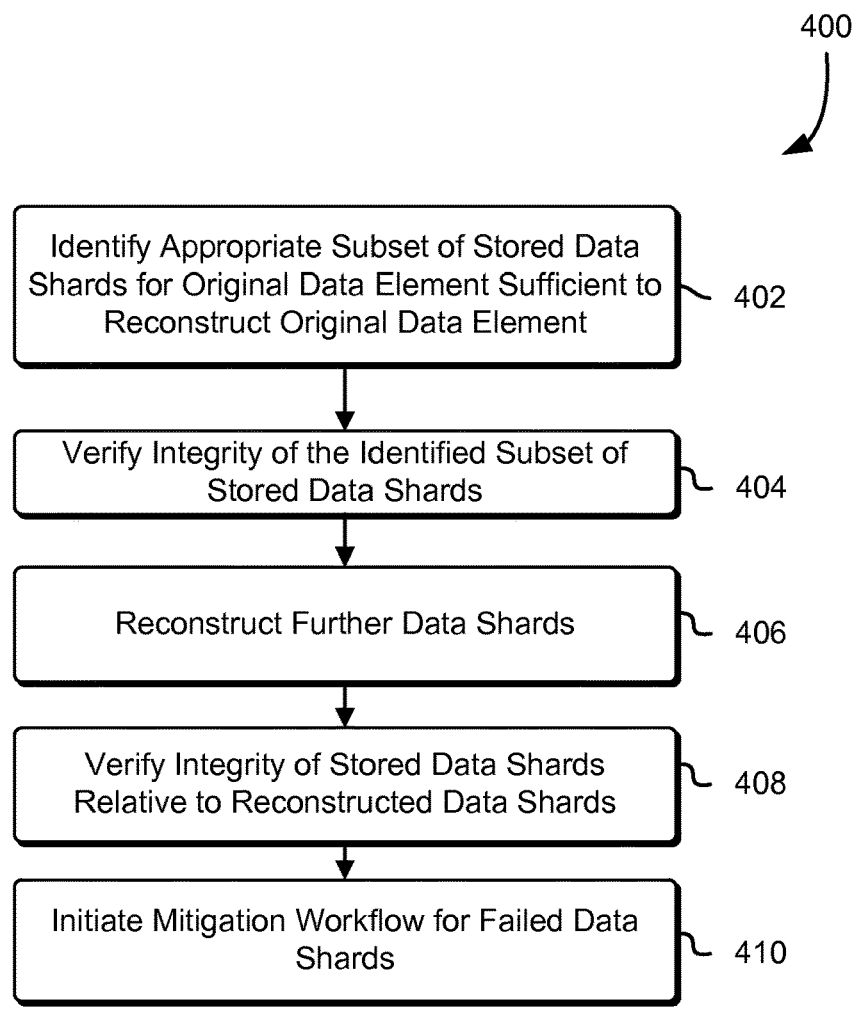
FIG. 4 schematically illustrates an example process for verifying integrity of stored data shards, in accordance with some embodiments.

FIG. 4 schematically illustrates an example process for verifying integrity of stored data shards, in accordance with some embodiments. At step 402, an entity such as a integrity checking entity described above in connection FIGS. 1-3 identifies a subset of stored data shards associated with an original data element, such as that of a customer of a computing resource service provider, that is sufficient to reconstruct the original data element. As previously discussed, the stored data shards may be a redundancy coded version of the original data element, such that a predetermined minimum quantity of the coded data shards (e.g., less than all of the coded data shards) may be sufficient to regenerate, such as by the integrity checking entity or by the data storage system on which the coded data shards are stored, the entire original data element.

At step 404, the integrity of the identified subset of stored data shards is verified, such as by the integrity checking entity. As previously discussed, in some embodiments, the verification of the identified subset may involve reconstruction of a reconstructed version of the original data element therefrom, whereupon the reconstructed version (or integrity information associated therewith) is verified against an analogous known good value (e.g., the original data element itself, or the integrity information associated therewith).

At step 406, further data shards are reconstructed, such as by using a reconstructed version of the original data element generated in connection with step 404, or by using the original data element itself. As previously described, the integrity checking entity may perform the reconstruction. Also as previously described, the quantity, content, and identity of the reconstructed data shards may be sensitive to a number of factors, including identifying any stored data shards that were not used to generate a reconstructed version of the original data element.

At step 408, the integrity of the stored data shards are compared relative to the reconstructed data shards, such as by the integrity checking entity. As previously described, such a comparison may be direct or indirect, and may use either previously generated and/or stored integrity information, or in some embodiments, integrity information generated at the time of the comparison.

At step 410, to the extent that any data shards are identified as invalid or corrupt (e.g., failed), a mitigation workflow may be initiated, such as by the integrity checking entity or the data storage system. As previously discussed, the mitigation workflow may be manual, automated, or aspects of both, and may be implemented so as to identify a root cause of the failed data shard and/or to repair and/or replace the failed data shard.

Figure 5:
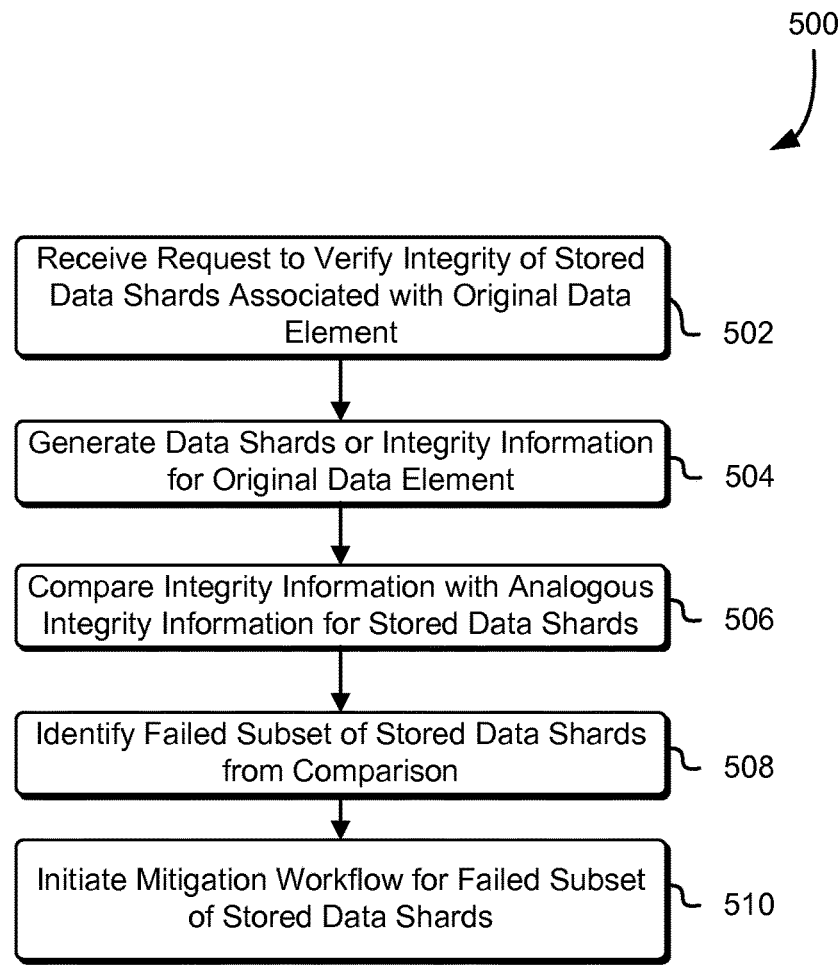
FIG. 5 schematically illustrates an example process for identifying failed or corrupted data shards amongst stored data shards associated with an original data element, in accordance with some embodiments.

FIG. 5 schematically illustrates an example process for identifying failed or corrupted data shards amongst stored data shards associated with an original data element, in accordance with some embodiments. At step 502, a request is received by, e.g., a computing resource service provider, such as via an application programming interface call or web service call, to verify the integrity of stored data shards associated with an original data element. As previously discussed, the original data element may a data provided by a customer of the computing resource service provider, and the customer may also provide the request through the API call or the web service call.

At a time after receiving the request in connection with step 502, at step 504, an entity, such as an integrity checking entity, applies one or more redundancy coding schemes (e.g., erasure coding schemes) to the original data element, thereby generating reconstructed data shards. As previously discussed, such generated reconstructed data shards may be encoded using the same or similar redundancy coding scheme as previously used to store the data shards in connection with the original data element, e.g., on the data storage server. In some embodiments, also as previously discussed, integrity information, such as hash values arising from hash functions, are also generated therewith.

At step 506, the integrity information associated with the reconstructed data shards is compared with integrity information associated with the analogous stored data shards derived from the original data element. As previously discussed, in certain embodiments, only a portion of the reconstructed data shards may be used to generate the integrity information, e.g., so as to improve performance and decrease computational load.

At step 508, to the extent that one or more of the compared data shards do not match, a failed subset of the stored data shards may be identified. In embodiments where integrity information is used, such as hash values, it is contemplated that even a small change in the underlying data may provide a much larger change in the associated integrity information, thereby making it considerably less onerous for the system to identify whether a given stored data shard is valid or invalid.

At step 510, a mitigation workflow is initiated, such as by the integrity checking entity or the data storage system. As previously discussed, the mitigation workflow may be manual, automated, or aspects of both, and may be implemented so as to identify a root cause of the failed data shard and/or to repair and/or replace the failed data shard(s).

Figure 6:
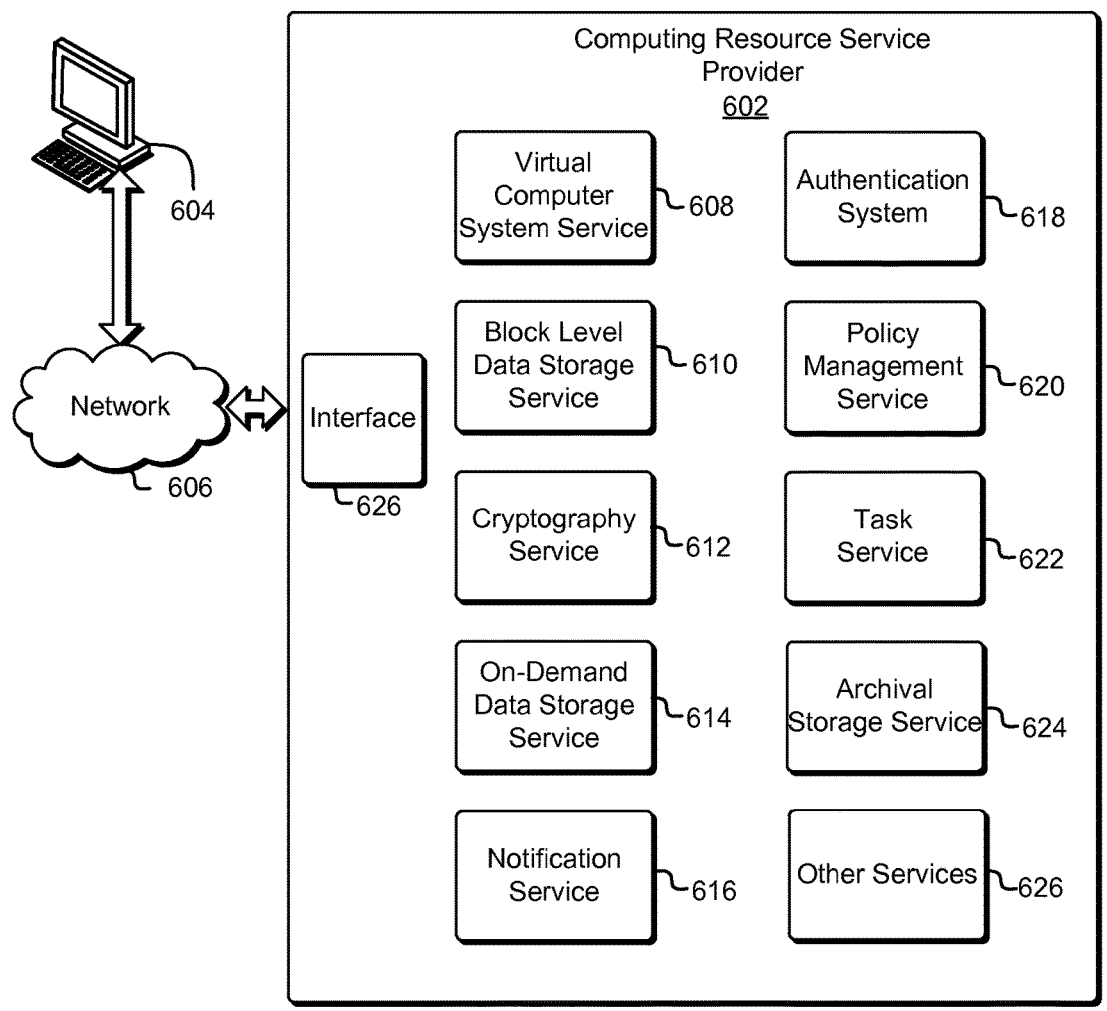
FIG. 6 schematically illustrates an environment, including a computing resource service provider, in which various integrity verification schemes may be implemented, in accordance with some embodiments.

FIG. 6 shows an example of a customer connected to a computing resource service provider in accordance with at least one embodiment. The computing resource service provider 602 may provide a variety of services to the customer 604 and the customer 604 may communicate with the computing resource service provider 602 via an interface 626, which may be a web services interface or any other type of customer interface. While FIG. 6 shows one interface 626 for the services of the computing resource service provider 602, each service may have its own interface and, generally, subsets of the services may have corresponding interfaces in addition to or as an alternative to the interface 626. The customer 604 may be an organization that may utilize one or more of the services provided by the computing resource service provider 602 to maintain and deliver information to its employees, which may be located in various geographical locations. Additionally, the customer 604 may be an individual that utilizes the services of the computing resource service provider 602 to deliver content to a working group located remotely. As shown in FIG. 6, the customer 604 may communicate with the computing resource service provider 602 through a network 606, whereby the network 606 may be a communication network, such as the Internet, an intranet or an Internet service provider (ISP) network. Some communications from the customer 604 to the computing resource service provider 602 may cause the computing resource service provider 602 to operate in accordance with one or more embodiments described or a variation thereof.

The computing resource service provider 602 may provide various computing resource services to its customers. The services provided by the computing resource service provider 602, in this example, include a virtual computer system service 608, a block-level data storage service 610, a cryptography service 612, an on-demand data storage service 614, a notification service 616, an authentication system 618, a policy management service 620, a task service 622 and one or more other services 624. It is noted that not all embodiments described include the services 608-624 described with reference to FIG. 6 and additional services may be provided in addition to or as an alternative to services explicitly described. As described, each of the services 608-624 may include one or more web service interfaces that enable the customer 604 to submit appropriately configured API calls to the various services through web service requests. In addition, each of the services may include one or more service interfaces that enable the services to access each other (e.g., to enable a virtual computer system of the virtual computer system service 608 to store data in or retrieve data from the on-demand data storage service 614 and/or to access one or more block-level data storage devices provided by the block level data storage service 610).

The virtual computer system service 608 may be a collection of computing resources configured to instantiate virtual machine instances on behalf of the customer 604. The customer 604 may interact with the virtual computer system service 608 (via appropriately configured and authenticated API calls) to provision and operate virtual computer systems that are instantiated on physical computing devices hosted and operated by the computing resource service provider 602. The virtual computer systems may be used for various purposes, such as to operate as servers supporting a website, to operate business applications or, generally, to serve as computing power for the customer. Other applications for the virtual computer systems may be to support database applications, electronic commerce applications, business applications, and/or other applications. Although the virtual computer system service 608 is shown in FIG. 6, any other computer system or computer system service may be utilized in the computing resource service provider 602, such as a computer system or computer system service that does not employ virtualization or instantiation and instead provisions computing resources on dedicated or shared computers/servers and/or other physical devices.

The block-level data storage service 610 may comprise one or more computing resources that collectively operate to store data for a customer 604 using block-level storage devices (and/or virtualizations thereof). The block-level storage devices of the block-level data storage service 610 may, for instance, be operationally attached to virtual computer systems provided by the virtual computer system service 608 to serve as logical units (e.g., virtual drives) for the computer systems. A block-level storage device may enable the persistent storage of data used/generated by a corresponding virtual computer system where the virtual computer system service 608 may only provide ephemeral data storage.

The computing resource service provider 602 also includes a cryptography service 612. The cryptography service 612 may utilize one or more storage services of the computing resource service provider 602 to store keys of the customers in encrypted form, whereby the keys may be usable to decrypt customer 612 keys accessible only to particular devices of the cryptography service 612.

The computing resource service provider 602 further includes an on-demand data storage service 614. The on-demand data storage service 614 may be a collection of computing resources configured to synchronously process requests to store and/or access data. The on-demand data storage service 614 may operate using computing resources (e.g., databases) that enable the on-demand data storage service 614 to locate and retrieve data quickly, to allow data to be provided in responses to requests for the data. For example, the on-demand data storage service 614 may maintain stored data in a manner such that, when a request for a data object is retrieved, the data object can be provided (or streaming of the data object can be initiated) in a response to the request. As noted, data stored in the on-demand data storage service 614 may be organized into data objects. The data objects may have arbitrary sizes except, perhaps, for certain constraints on size. Thus, the on-demand data storage service 614 may store numerous data objects of varying sizes. The on-demand data storage service 614 may operate as a key value store that associates data objects with identifiers of the data objects that may be used by the customer 604 to retrieve or perform other operations in connection with the data objects stored by the on-demand data storage service 614.

In the environment illustrated in FIG. 6, a notification service 616 is included. The notification service 616 may comprise a collection of computing resources collectively configured to provide a web service or other interface and browser-based management console. The management console can be used to configure topics for which customers seek to receive notifications, configure applications (or people), subscribe clients to the topics, publish messages, or configure delivery of the messages over clients' protocol of choice (i.e., hypertext transfer protocol (HTTP), e-mail and short message service (SMS), among others). The notification service 616 may provide notifications to clients using a "push" mechanism without the need to check periodically or "poll" for new information and updates. The notification service 616 may further be used for various purposes such as monitoring applications executing in the virtual computer system service 608, workflow systems, time-sensitive information updates, mobile applications, and many others.

As illustrated in FIG. 6, the computing resource service provider 602, in various embodiments, includes an authentication system 618 and a policy management service 620. The authentication system 618, in an embodiment, is a computer system (i.e., collection of computing resources) configured to perform operations involved in authentication of users of the customer. For instance, one of the services 608-616 and 620-624 may provide information from a user to the authentication system 618 to receive information in return that indicates whether the user requests are authentic.

The policy management service 620, in an embodiment, is a computer system configured to manage policies on behalf of customers (such as customer 604) of the computing resource service provider 602. The policy management service 620 may include an interface that enables customers to submit requests related to the management of policy. Such requests may, for instance, be requests to add, delete, change, or otherwise modify policy for a customer or for other administrative actions, such as providing an inventory of existing policies and the like.

The computing resource service provider 602, in various embodiments, is also equipped with a task service 622. The task service 622 is configured to receive a task package from the customer 604 and enable executing tasks as dictated by the task package. The task service 622 may be configured to use any resource of the computing resource service provider 602, such as one or more instantiated virtual machines or virtual hosts, for executing the task. The task service 624 may configure the one or more instantiated virtual machines or virtual hosts to operate using a selected operating system and/or a selected execution application in accordance with a requirement of the customer 604.

The computing resource service provider 602 additionally maintains one or more other services 624 based at least in part on the needs of its customers 604. For instance, the computing resource service provider 602 may maintain a database service for its customers 604. A database service may be a collection of computing resources that collectively operate to run one or more databases for one or more customers 604. The customer 604 may operate and manage a database from the database service by utilizing appropriately configured API calls. This, in turn, may allow a customer 604 to maintain and potentially scale the operations in the database. Other services include, but are not limited to, object-level archival data storage services, services that manage and/or monitor other services.

The computing resource service provider 602 further includes an archival storage service 624. The archival storage service 624 may comprise a collection of computing resources that collectively operate to provide storage for data archiving and backup of customer data. The data may comprise one or more data files that may be combined to form an archive. The archival storage service 624 may be configured to persistently store data that may be infrequently accessed and for which long retrieval times are acceptable to a customer utilizing the archival storage service 624. A customer may interact with the archival storage service 624 (for example, through appropriately configured API calls made to the archival storage service 624) to generate one or more archives, upload and retrieve the one or more archives or monitor the generation, upload or retrieval of the one or more archives.

The computing resource service provider 602 additionally maintains one or more other services 626 based at least in part on the needs of its customers 604. For instance, the computing resource service provider 602 may maintain a database service for its customers 604. A database service may be a collection of computing resources that collectively operate to run one or more databases for one or more customers 604. The customer 604 may operate and manage a database from the database service by utilizing appropriately configured API calls. This, in turn, may allow a customer 604 to maintain and potentially scale the operations in the database. Other services include, but are not limited to, object-level archival data storage services, services that manage and/or monitor other services.

Figure 7:
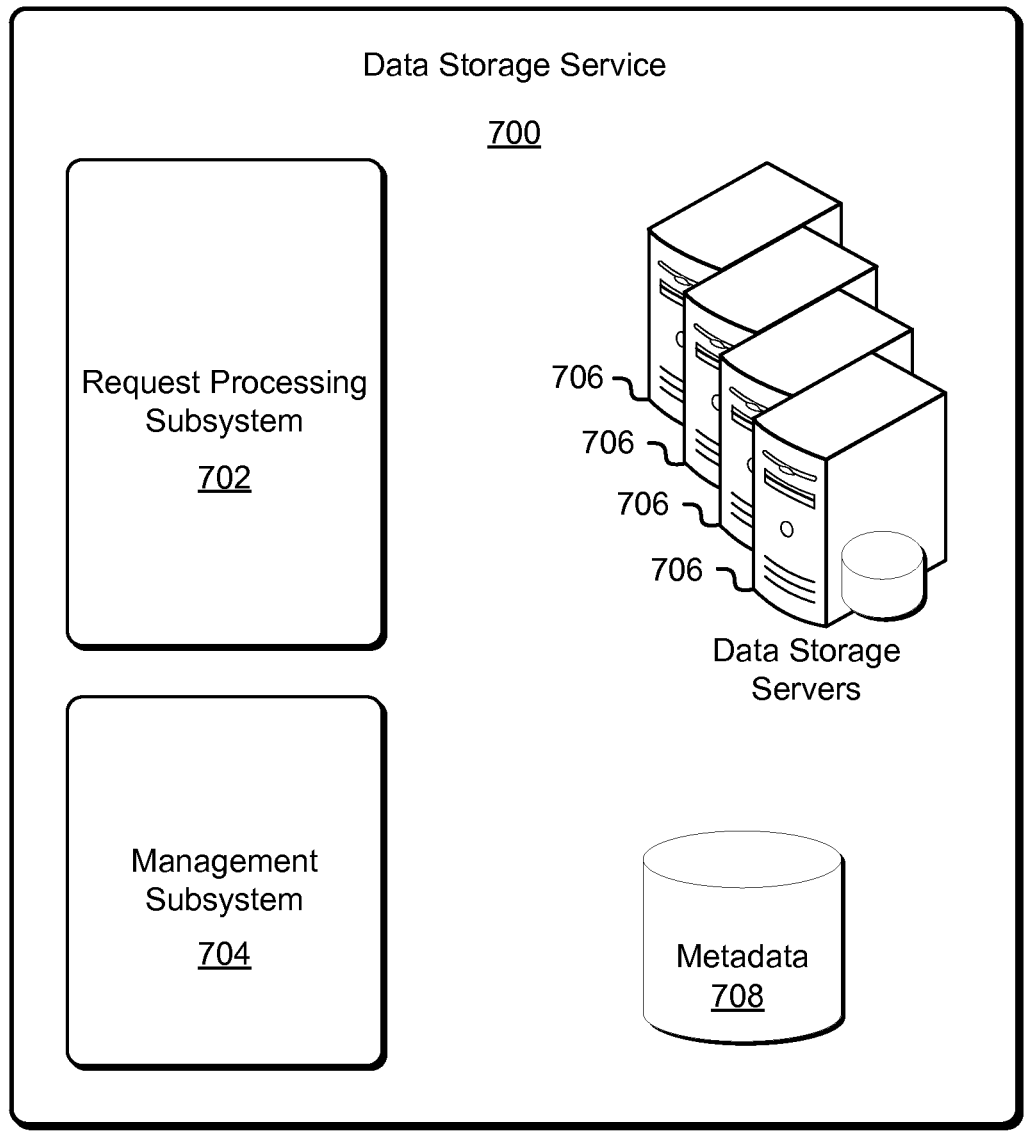
FIG. 7 schematically illustrates a data storage service capable of implementing various integrity verification schemes, in accordance with some embodiments.

FIG. 7 shows an illustrative example of a data storage service in accordance with various embodiments. The data storage service 700 may be a service of a computing resource provider used to operate an on-demand data storage service such as described above in connection with FIG. 6. As illustrated in FIG. 7, the data storage service 700 includes various subsystems such as a request processing subsystem 702 and a management subsystem 704. The data storage service 700 may also include a plurality of data storage servers 706 and a metadata storage 708, which may store metadata about various data objects stored among the data storage servers 706 as described. In an embodiment, the request processing subsystem 702 is a collection of computing resources, such as webservers and application servers, collectively configured to process requests submitted to the data storage service 700. The request processing subsystem 702, for example, may include one or more webservers that provide a web service interface to enable customers of the data storage service 700 to submit requests to be processed by the data storage service 700. The request processing subsystem 702 may include computers systems configured to make various determinations in connection with the processing of requests, such as whether policy allows fulfillment of a request, whether requests are authentic (e.g., electronically signed using a suitable cryptographic key) and otherwise.

Components of the request processing subsystem may interact with other components of the data storage service 700 (e.g., through network communications). For example, some requests submitted to the request processing subsystem 702 may involve the management of computing resources which may include data objects stored by the data storage servers 706. The request processing subsystem 702, for example, may receive and process requests to modify computing resources. For instance, in some examples, data objects are logically organized into logical data containers. Data objects associated with a logical data container may, for example, be said to be in the logical data container. Requests to the data processing subsystem 702 may include requests for creating logical data containers, deleting logical data containers, providing an inventory of a logical data container, providing or updating access control policy with respect to one or more logical data containers and the like.

The requests may be processed by the management subsystem 704 upon receipt by the request processing subsystem 702. If applicable, various requests processed by the request processing subsystem 702 and/or management subsystem 704, may result in the management subsystem 704 updating metadata associated with data objects and logical data containers stored in the metadata store 708. Other requests that may be processed by the request processing subsystem 702 include requests to perform operations in connection with data objects. The requests, for example, may include requests to upload data objects to the data storage service 700, to download data objects from the data storage service 700, to delete data objects stored by the data storage service 700 and/or other operations that may be performed.

Requests processed by the request processing subsystem 702 that involve operations on data objects (upload, download, delete, e.g.) may include interaction between the request processing subsystem 702 and one or more data storage servers 706. The data storage servers 706 may be computer system communicatively coupled with one or more storage devices for the persistent of data objects. For example, in order to process a request to upload a data object, the request processing subsystem may transmit data to a data storage server 706 for persistent storage. It is noted, however, that in some embodiments, client (e.g., customer) computer systems may transmit data directly to the data storage servers 706 instead of through severs in the request processing subsystem.

In some embodiments, the request processing subsystem 702 transmits data to multiple data storage servers 706 for the purposes of redundantly storing the data to allow the retrievability of data in the event of failure of an individual data storage server 706 and/or associated data storage device. For example, in some embodiments, the request processing subsystem uses a redundancy in coding scheme such as erasure coding to deconstruct a data object into multiple parts that are stored among the data storage servers 706. The parts may be configured such that if access to a certain number of parts is lost, the data object may nevertheless be reconstructible from the remaining parts that remain accessible.

To enable efficient transfer of data between the request processing subsystem 702 and the data storage servers 706 and/or generally to enable quick processing of requests, the request processing subsystem 702 may include one or more databases that enable the location of data among the data storage servers 706. For example, the request processing subsystem 702 may operate a key value store that serves to associate identifiers of data objects with locations among the data storage servers 706 for accessing data of the data objects.

Figure 8:
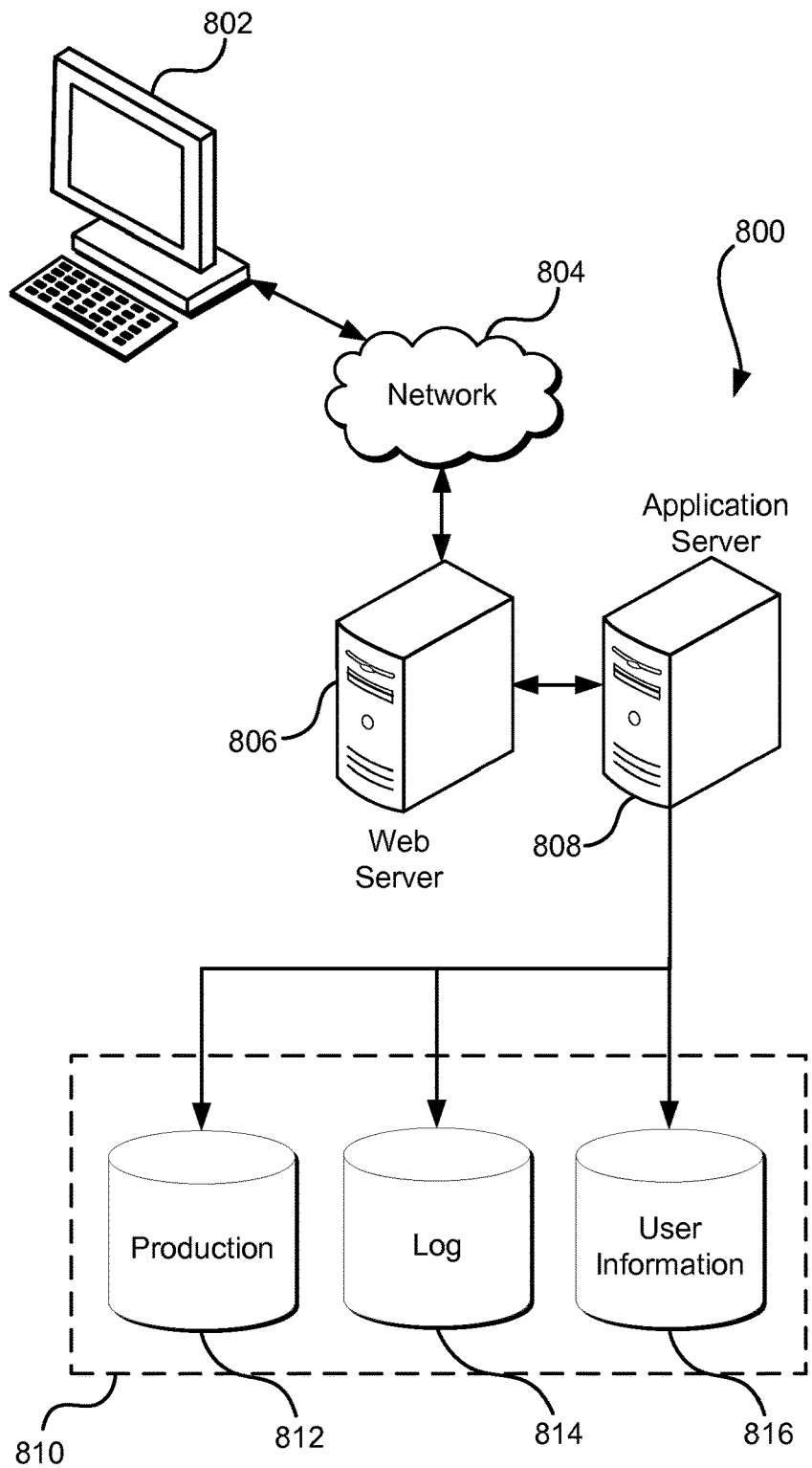
FIG. 8 illustrates an environment in which various embodiments can be implemented.

FIG. 8 illustrates aspects of an example environment 800 for implementing aspects in accordance with various embodiments. As will be appreciated, although a web-based environment is used for purposes of explanation, different environments may be used, as appropriate, to implement various embodiments. The environment includes an electronic client device 802, which can include any appropriate device operable to send and/or receive requests, messages or information over an appropriate network 804 and, in some embodiments, convey information back to a user of the device. Examples of such client devices include personal computers, cell phones, handheld messaging devices, laptop computers, tablet computers, set-top boxes, personal data assistants, embedded computer systems, electronic book readers and the like. The network can include any appropriate network, including an intranet, the Internet, a cellular network, a local area network, a satellite network or any other such network and/or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there can be several application servers, layers or other elements, processes or components, which may be chained or otherwise configured, which can interact to perform tasks such as obtaining data from an appropriate data store. Servers, as used herein, may be implemented in various ways, such as hardware devices or virtual computer systems. In some contexts, servers may refer to a programming module being executed on a computer system. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered environment. The application server can include any appropriate hardware, software and firmware for integrating with the data store as needed to execute aspects of one or more applications for the client device, handling some or all of the data access and business logic for an application. The application server may provide access control services in cooperation with the data store and is able to generate content including, but not limited to, text, graphics, audio, video and/or other content usable to be provided to the user, which may be served to the user by the web server in the form of HyperText Markup Language ("HTML"), Extensible Markup Language ("XML"), JavaScript, Cascading Style Sheets ("CSS") or another appropriate client-side structured language. Content transferred to a client device may be processed by the client device to provide the content in one or more forms including, but not limited to, forms that are perceptible to the user audibly, visually and/or through other senses including touch, taste, and/or smell. The handling of all requests and responses, as well as the delivery of content between the client device 802 and the application server 808, can be handled by the web server using PHP: Hypertext Preprocessor ("PHP"), Python, Ruby, Perl, Java, HTML, XML or another appropriate server-side structured language in this example. It should be understood that the web and application servers are not required and are merely example components, as structured code discussed herein can be executed on any appropriate device or host machine as discussed elsewhere herein. Further, operations described herein as being performed by a single device may, unless otherwise clear from context, be performed collectively by multiple devices, which may form a distributed and/or virtual system.

The data store 810 can include several separate data tables, databases, data documents, dynamic data storage schemes and/or other data storage mechanisms and media for storing data relating to a particular aspect of the present disclosure. For example, the data store illustrated may include mechanisms for storing production data 812 and user information 816, which can be used to serve content for the production side. The data store also is shown to include a mechanism for storing log data 814, which can be used for reporting, analysis or other such purposes. It should be understood that there can be many other aspects that may need to be stored in the data store, such as page image information and access rights information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. The application server 808 may provide static, dynamic or a combination of static and dynamic data in response to the received instructions. Dynamic data, such as data used in web logs (blogs), shopping applications, news services and other such applications may be generated by server-side structured languages as described herein or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the user device 802. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment, in one embodiment, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network. These devices also can include virtual devices such as virtual machines, hypervisors and other virtual devices capable of communicating via a network.

Various embodiments of the present disclosure utilize at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network and any combination thereof.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A system, comprising:
   one or more processors; and
   memory including instructions that, as a result of execution by the one or more processors, cause the system to:
      obtain a first subset of a set of data shards, the first subset of the set of data shards being sufficient for generating a data element from which the set of data shards was derived;
      use the obtained first subset of the set of data shards to generate a second subset of the set of data shards, the second subset of the set of data shards having at least one member with contents differing from any member of the first subset of the set of data shards;
      store the generated second subset of the set of data shards to enable use, by the system, of a data shard of the generated second subset to verify integrity of a data shard in the first subset using only the generated second subset; and
      process a request to verify integrity of data associated with the first subset by processing, for a shard of the first subset, a different shard only belonging to the generated second subset.

2. The system of claim 1, wherein the system uses the obtained first subset of the set of data shards to generate the second subset of the set of data shards using an erasure coding scheme.

3. The system of claim 1, wherein the first subset of the set of data shards has a number of members that is equal to a minimum number of members sufficient for reconstructing the data object.

4. The system of claim 1, wherein the system verifies the integrity of the different data shard by computing a data integrity value of the shard and determines whether the computed data integrity value matches a stored data integrity value for the other data shard.

5. The system of claim 4, wherein the stored data integrity value is used by a data storage device to locally verify integrity of the different data shard.

6. The system of claim 1, wherein the different data shard was generated and written to data storage prior to use of the obtained first subset of the set of data shards to generate the second subset of the set of data shards.

7. The system of claim 1, wherein the first subset of the set of data shards is obtained by deriving the first subset from a copy of the data element.

8. The system of claim 1, wherein the instructions further include instructions that, as a result of execution by the one or more processors, cause the system to verify integrity of the first subset of the set of data shards as a prerequisite for generation of the second subset of the set of data shards.

9. A computer-implemented method, comprising:
   obtaining a first subset of a set of data shards stored on a data storage system, the first subset of the set of data shards being sufficient for generating a data element from which the set of data shards was derived;
   using the obtained first subset of the set of data shards to generate a second subset of the set of data shards, the second subset of the set of data shards having at least one member with contents differing from any member of the first subset of the set of data shards;
   storing the generated second subset of the set of data shards to enable use, by the data storage system, of a data shard of the generated second subset to verify integrity of a data shard in the first subset using only the generated second subset; and
   processing a request to verify integrity of data associated with the first subset by processing, for a shard of the first subset, a different shard only belonging to the generated second subset.

10. The computer-implemented method of claim 9, wherein the first subset of the set of data shards is used to generate the second subset of the set of data shards using an erasure coding scheme.

11. The computer-implemented method of claim 9, wherein the first subset of the set of data shards has a number of members that is equal to a minimum number of members sufficient for reconstructing the data object.

12. The computer-implemented method of claim 9, further comprising:
   verifying the integrity of the different data shard by computing a data integrity value of the shard; and
   determining whether the computed data integrity value matches a stored data integrity value for the other data shard.

13. The computer-implemented method of claim 12, wherein the stored data integrity value is used by a data storage device of the data storage system to locally verify integrity of the different data shard.

14. The computer-implemented method of claim 9, wherein the different data shard was generated and written to data storage of the data storage system prior to using the obtained first subset of the set of data shards to generate the second subset of the set of data shards.

15. The computer-implemented method of claim 9, wherein the first subset of the set of data shards is obtained by deriving the first subset from a copy of the data element.

16. The computer-implemented method of claim 9, further comprising verifying integrity of the first subset of the set of data shards as a prerequisite for generating the second subset of the set of data shards.

17. A non-transitory computer-readable storage medium having stored thereon executable instructions that, as a result of execution by one or more processors of a computer system, cause the computer system to at least:
obtain a first subset of a set of data shards, the first subset of the set of data shards being sufficient for generating a data element from which the set of data shards was derived;
use the obtained first subset of the set of data shards to generate a second subset of the set of data shards, the second subset of the set of data shards having at least one member with contents differing from any member of the first subset of the set of data shards;
store the generated second subset of the set of data shards to enable use, by the computer system, of a data shard of the generated second subset to verify integrity of a data shard in the first subset using only the generated second subset; and
process a request to verify integrity of data associated with the first subset by processing, for a shard of the first subset, a different shard only belonging to the generated second subset.

18. The non-transitory computer-readable storage medium of claim 17, wherein the instructions, as a result of execution, further cause the computer system to use the obtained first subset of the set of data shards to generate the second subset of the set of data shards using an erasure coding scheme.

19. The non-transitory computer-readable storage medium of claim 17, wherein the instructions, as a result of execution, further cause the computer system to verify the integrity of the different data shard by computing a data integrity value of the shard and determine whether the computed data integrity value matches a stored data integrity value for the other data shard.

20. The non-transitory computer-readable storage medium of claim 19, wherein the stored data integrity value is used by a data storage device of the computer system to locally verify integrity of the different data shard.

* * * * *